(12) United States Patent
Hu et al.

(10) Patent No.: US 9,144,182 B2
(45) Date of Patent: Sep. 22, 2015

(54) ELECTRONIC DEVICE WITH ROTATABLE STOP PLATE

(71) Applicant: HON HAI PRECISION INDUSTRY CO., LTD., New Taipei (TW)

(72) Inventors: Jin-Jia Hu, New Taipei (TW); Teng-Yuan Shu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 218 days.

(21) Appl. No.: 13/965,207

(22) Filed: Aug. 13, 2013

(65) Prior Publication Data
US 2014/0334111 A1    Nov. 13, 2014

(30) Foreign Application Priority Data
May 8, 2013   (TW) .............................. 102116438 A

(51) Int. Cl.
*H05K 7/00* (2006.01)
*H05K 7/20* (2006.01)
(52) U.S. Cl.
CPC .................................. *H05K 7/20909* (2013.01)

(58) Field of Classification Search
USPC ......... 361/728–730, 752, 796, 800, 755, 756, 361/727; 312/223.1, 223.2
See application file for complete search history.

(56) References Cited

U.S. PATENT DOCUMENTS

| | | | |
|---|---|---|---|
| 6,377,451 B1 * | 4/2002 | Furuya ...................... 361/679.32 |
| 6,747,877 B2 * | 6/2004 | Tonozuka ...................... 361/797 |
| 7,092,245 B2 * | 8/2006 | Shih ........................ 361/679.33 |
| 7,679,898 B2 * | 3/2010 | Peng et al. .............. 361/679.37 |
| 7,864,519 B2 * | 1/2011 | Lin et al. .................. 361/679.33 |
| 7,990,725 B2 * | 8/2011 | Wu et al. ....................... 361/730 |

* cited by examiner

*Primary Examiner* — Hung S Bui
(74) *Attorney, Agent, or Firm* — Novak Druce Connolly Bove + Quigg LLP

(57) ABSTRACT

An electronic device includes a receiving bracket and two electronic modules. The receiving bracket includes a partition plate to divide the receiving bracket into a first receiving space and a second receiving space. Each of the first receiving space and second receiving space includes an outlet located at an end of the receiving bracket. The partition plate defines a through slot. A stop plate is pivotably connected to an end of the through slot near the outlets. Two resilient tabs are formed on opposite sides of the stop plate, and respectively face the first receiving space and second receiving space. The electronic modules are received in the first receiving space and second receiving space, and deform the resilient tabs.

9 Claims, 3 Drawing Sheets

ELECTRONIC DEVICE WITH ROTATABLE STOP PLATE

BACKGROUND

1. Technical Field

The present disclosure relates to an electronic device with rotatable stop plates.

2. Description of Related Art

In an electronic device, two power supply units may be mounted in a chassis of the electronic device from up and down. If one of the power supply units is taken away, airflow from system fans will flow out of the chassis from the space once occupied by the power supply unit taken away. The other power supply unit in the chassis obtains less airflow, thereby the heat dissipation of the other power supply unit is less than optimal.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
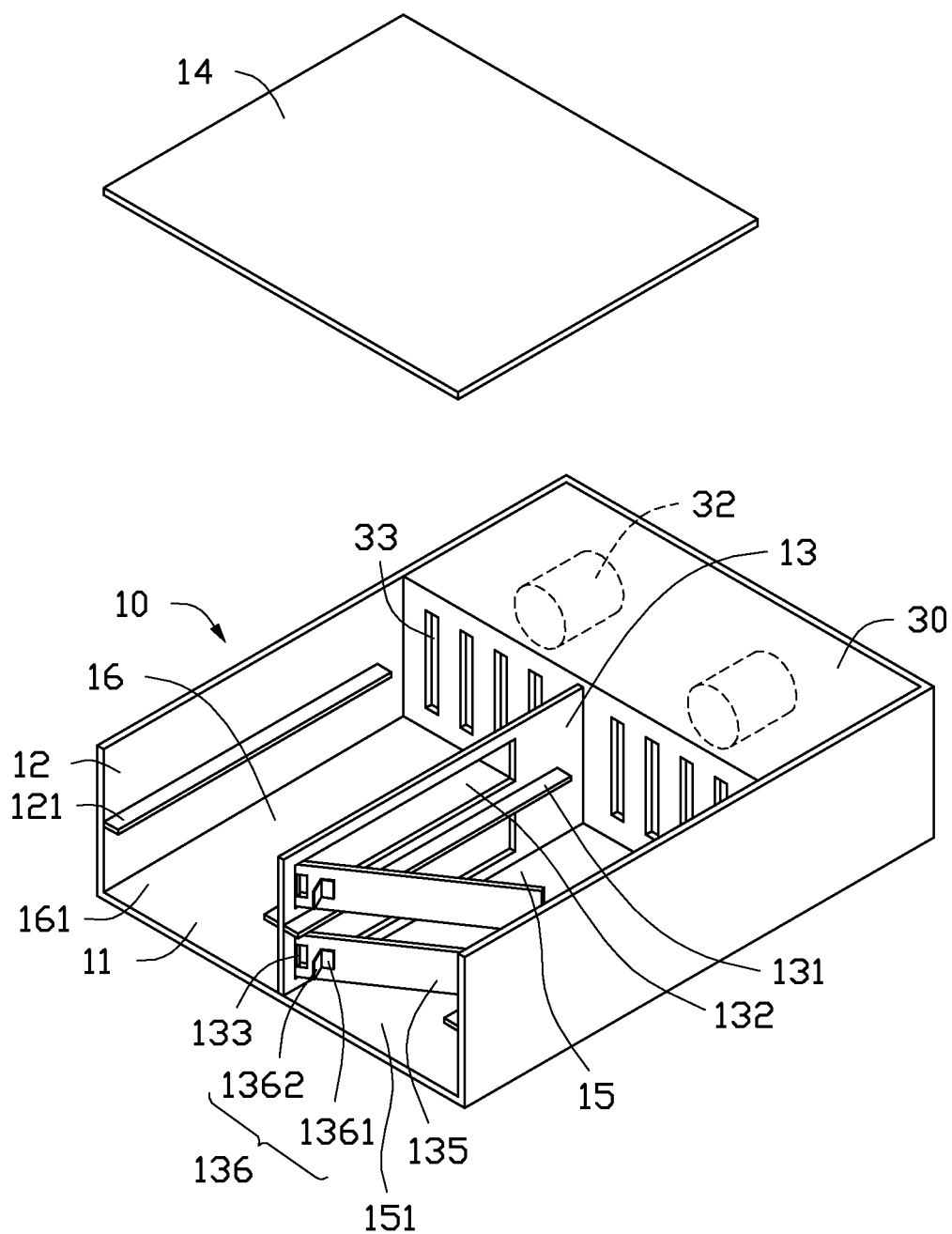
FIG. 1 is an isometric view of an embodiment of an electronic device.
Figure 2:
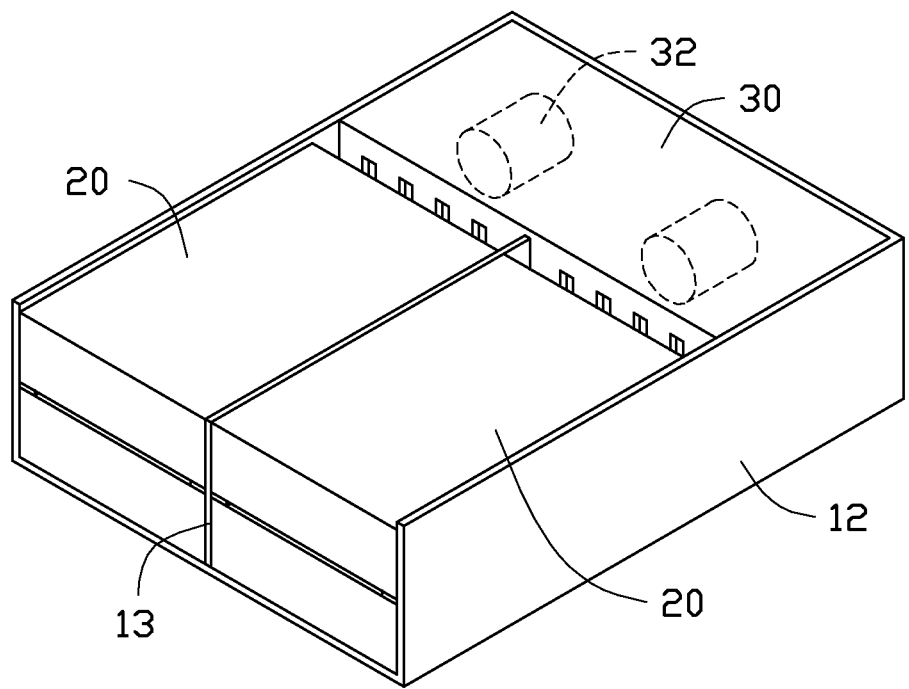
FIG. 2 is similar to FIG. 1, but shows a plurality of electronic modules mounted in the electronic device.

FIGS. 1 and 2 show an exemplary embodiment of an electronic device. The electronic device includes a receiving bracket 10, four electronic modules 20, and a casing 30 connected to a rear end of the receiving bracket 10. In the embodiment, the electronic modules 20 are power supply units.

The receiving bracket 10 includes a bottom plate 11, two side plates 12 perpendicularly extending up from opposite sides of the bottom plate 11, a partition plate 13 perpendicularly extending up from a middle of the bottom plate 11, and a top cover 14 connected to tops of the side plates 12 and partition plate 13. To see the inner structure of the receiving bracket 10 clearly, the top cover 14 is placed above the side plates 12 in FIG. 1.

The partition plate 13 divides the receiving bracket 10 into a first receiving space 15 and a second receiving space 16. The first receiving space 15 defines an outlet 151 in a front end of the first receiving space 15. The second receiving space 16 defines an outlet 161 in a front end of the second receiving space 16. A supporting portion 121 extends from a middle of an inner surface of each side plate 12. Two supporting portions 131 extend from middles of opposite sides of the partition plate 13. Two through slots 132 are defined in the partition plate 13, located above and below the supporting portions 131. Two pivoting poles 133 are mounted to the partition plate 13, and are located in front ends of the through slots 132. A stop plate 135 is pivotably connected to each pivoting pole 133. Two resilient tabs 136 are formed on opposite sides of each stop plate 135, near the corresponding pivoting pole 133. Each resilient tab 136 includes a fastening portion 1361 fastened to the stop plate 135, and an extension portion 1362 extending from a side of the fastening portion 1361 near the corresponding pivoting pole 133. In the embodiment, the extension portion 1362 of each resilient tab 136 is substantially perpendicular to the fastening portion 1361 of the resilient tab 136.

A plurality of system fans 32 is mounted in the casing 30. A plurality of through holes 33 is defined in a front side of the casing 30. Airflow generated by the system fans 32 flows toward the receiving bracket 10 through the through holes 33.

To mount the electronic modules 20, two of the electronic modules 20 are respectively received in lower portions of the first receiving space 15 and the second receiving space 16. Each of the two electronic modules 20 is supported on the bottom plate 11, and is sandwiched between the partition plate 13 and the corresponding side plate 12. Thereby the lower stop plate 135 is received in the corresponding through slot 132. Each extension portion 1362 of the lower stop plate 135 is deformed, and is sandwiched between the lower stop plate 135 and the corresponding electronic module 20. The other two of the electronic modules 20 are received in upper portions of the first receiving space 15 and the second receiving space 16. Each of the other two electronic modules 20 is supported on the supporting portion 131 and the corresponding supporting portion 121, and is sandwiched between the partition plate 13 and the corresponding side plate 12. Thereby the upper stop plate 135 is received in the corresponding through slot 132. Each extension portion 1362 of the upper stop plate 135 is deformed, and is sandwiched between the upper stop plate 135 and the corresponding electronic module 20.

Figure 3:
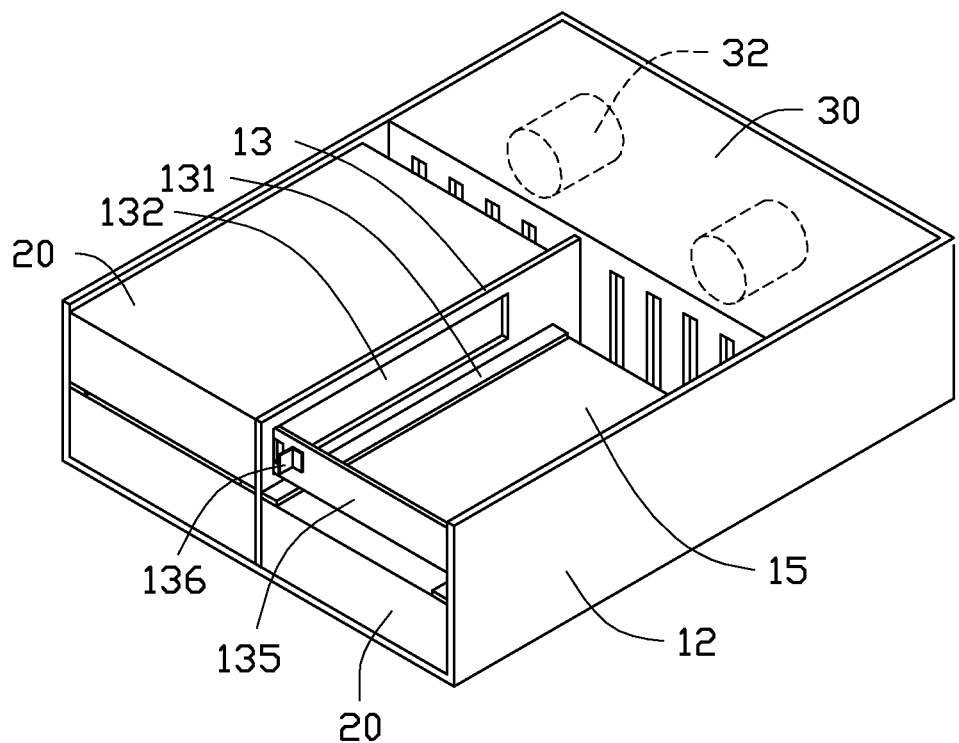
FIG. 3 is similar to FIG. 2, but shows a different state of use.

Referring to FIG. 3, when the electronic module 20 in the upper portion of the first receiving space 15 is removed, the extension portions 1362 of the upper stop plate 135 restore, to make the upper stop plate 135 rotate toward the first receiving space 15 to cover an upper portion of the outlet 151.

Similarly, when the electronic module 20 in the lower portion of the first receiving space 15 is removed, the extension portions 1362 of the lower stop plate 135 restore, to make the lower stop plate 135 rotate toward the first receiving space 15 to cover a lower portion of the outlet 151.

When the electronic module 20 in the upper portion of the second receiving space 16 is removed, the extension portions 1362 of the upper stop plate 135 restore, to make the upper stop plate 135 rotate toward the second receiving space 16 to cover an upper portion of the outlet 161.

When the electronic module 20 in the lower portion of the second receiving space 16 is removed, the extension portions 1362 of the lower stop plate 135 restore, to make the lower stop plate 135 rotate toward the second receiving space 16 to cover a lower portion of the outlet 161.

If any one of the electronic modules 20 is taken away, the corresponding stop plate 135 is rotated to a corresponding position at the front end of the receiving bracket 10, to block the airflow generated by the system fans 32. Therefore, the remaining electronic modules 20 in the receiving bracket 10 still obtain enough airflow.

Even though numerous characteristics and advantages of the embodiments have been set forth in the foregoing description, together with details of the structure and the functions of the embodiments, the disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. An electronic device, comprising:
   a receiving bracket comprising a partition plate to divide the receiving bracket into a first receiving space, and a second receiving space at opposite sides of the partition plate together with the first receiving space, each of the first receiving space and the second receiving space defining an outlet located at an end of the receiving bracket, the partition plate defining a through slot, a stop plate pivotably connected to an end of the through slot near the outlets, two resilient tabs formed on opposite sides of the stop plate and respectively facing the first receiving space and second receiving space; and
   two electronic modules received in the first receiving space and the second receiving space, and deforming the resilient tabs;
   wherein when the electronic module received in the first receiving space is taken away, the resilient tabs are restored to make the stop plate rotate toward the first receiving space to cover the outlet of the first receiving space; and
   wherein when the electronic module received in the second receiving space is taken away, the resilient tabs are restored to make the stop plate rotate toward the second receiving space to cover the outlet of the second receiving space.

2. The electronic device of claim 1, wherein a pivoting pole is mounted to the partition plate and located in the through slot near the outlets, the stop plate is pivotably connected to the pivoting pole.

3. The electronic device of claim 2, wherein the resilient tabs are near the pivoting poles.

4. The electronic device of claim 3, wherein each resilient tab comprises a fastening portion fastened to the stop plate, and an extension portion extending from a side of the fastening portion near the pivoting pole.

5. The electronic device of claim 4, wherein the extension portion is substantially perpendicular to the fastening portion.

6. The electronic device of claim 1, wherein the receiving bracket comprises a bottom plate, two side plates extending up from opposite sides of the bottom plate, and a top cover connected to tops of the side plates, the partition plate is parallel to the side plates.

7. An electronic device, comprising:
   a receiving bracket comprising a partition plate to divide the receiving bracket into a first receiving space, and a second receiving space juxtapositional with the first receiving space, each of the first receiving space and the second receiving space defining an outlet located at an end of the receiving bracket, upper and lower portions of the partition plate defining two through slots, a stop plate pivotably connected to an end of each through slot near the outlets, two resilient tabs formed on opposite sides of each stop plate; and
   four electronic modules, two of the electronic modules received in upper and lower portions of the first receiving space, the other two electronic modules received in upper and lower portions of the second receiving space;
   wherein each stop plate is received in the corresponding through slot and is sandwiched between the corresponding electronic modules, each resilient tab is resiliently sandwiched between the corresponding stop plate and the corresponding electronic module.

8. The electronic device of claim 7, wherein the receiving bracket comprises a bottom plate, two side plates extending up from opposite sides of the bottom plate, and a top cover connected to tops of the side plates, the partition plate is parallel to the side plates.

9. The electronic device of claim 8, wherein a first supporting portion extends from a middle of an inner surface of each side plate, two second supporting portions extend from opposite sides of the partition plate and located between the through slots, the electronic modules received in the upper portions of the first receiving space and the second receiving space are supported on the corresponding first supporting portions and the corresponding second supporting portions.

* * * * *